(12) United States Patent
Hennecke et al.

(10) Patent No.: US 10,276,256 B1
(45) Date of Patent: Apr. 30, 2019

(54) DATA REDUCTION USING ANALOG MEMORY

(71) Applicant: Infineon Technologies AG, Neubiberg (DE)

(72) Inventors: Marcus Edward Hennecke, Graz (AT); Franz Michael Darrer, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/910,370

(22) Filed: Mar. 2, 2018

(51) Int. Cl.
*G11C 27/00* (2006.01)
*G11C 27/02* (2006.01)
*G01S 7/486* (2006.01)

(52) U.S. Cl.
CPC .......... *G11C 27/024* (2013.01); *G01S 7/4861* (2013.01)

(58) Field of Classification Search
None
See application file for complete search history.

(56) References Cited

U.S. PATENT DOCUMENTS 5,726,934 A * 3/1998 Tran ............... G11C 11/5621
365/185.2

* cited by examiner

*Primary Examiner* — James G Norman
(74) *Attorney, Agent, or Firm* — Harrity & Harrity, LLP

(57) ABSTRACT

A device may include a first analog memory device to sample an analog input during a first time window of a sampling window, store a first analog signal based on sampling the analog input, and provide a first analog output after storing the first analog signal. The device may include a second analog memory device to sample the analog input during a second time window of the sampling window, store a second analog signal based on sampling the analog input, and provide a second analog output after storing the second analog signal. An output rate may be different from a sampling rate associated with sampling the analog input. An output order may be different from a sampling order associated with sampling the analog input. A time at which a read-out phase is performed, may be significantly different from a time at which a write phase is performed.

20 Claims, 8 Drawing Sheets

US 10,276,256 B1

DATA REDUCTION USING ANALOG MEMORY

BACKGROUND

A receiver (e.g., in a radio detection and ranging (RADAR) system, in a light detection and ranging (LiDAR) system, and/or the like) may generate data based on sampling one or more input signals. In a typical application, the receiver samples multiple analog signals, converts the sampled analog signals to digital signals (e.g., using one or more analog-to-digital converters (ADCs)) and buffers the digital signals (e.g., in random access memory (RAM) components of the ADCs) such that the digital signals can then be processed by one or more digital signal processors (DSPs) in order to extract the relevant data.

SUMMARY

According to some possible implementations, a device may include: a first analog memory device to sample an analog input during a first time window of a sampling window, store a first analog signal based on sampling the analog input during the first time window, and provide a first analog output after storing the first analog signal; and a second analog memory device to: sample the analog input during a second time window of the sampling window, store a second analog signal based on sampling the analog input during the second time window, and provide a second analog output after storing the second analog signal, wherein at least one of: an output rate, associated with providing the first and second analog outputs, is different from a sampling rate associated with sampling the analog input during the first and second time windows, an output order, associated with providing the first and second analog outputs, is different from a sampling order associated with sampling the analog input during the first and second time windows, or a time at which a read-out phase, associated with providing the first and second analog outputs, is performed, is significantly different from a time at which a write phase, associated with sampling the analog input during the first and second time windows, is performed.

According to some possible implementations, a method may include: sampling, by a first analog memory device, an analog input during a first time window of a sampling window; storing, by the first analog memory device, a first analog signal based on sampling the analog input during the first time window; sampling, by a second analog memory device, the analog input during a second time window of the sampling window; storing, by the second analog memory device, a second analog signal based on sampling the analog input during the second time window; providing, by the first analog memory device, a first analog output based on the first analog signal; and providing, by the second analog memory device, a second analog output based on storing the second analog signal, wherein at least one of: an output rate, associated with providing the first and second analog outputs, is different from a sampling rate, associated with sampling the analog input during the first and second time windows, an output order, associated with providing the first and second analog outputs, is different from a sampling order associated with sampling the analog input during the first and second time windows, or a time at which a read-out phase, associated with providing the first and second analog outputs, is performed, is significantly different from a time at which a write phase, associated with sampling the analog input during the first and second time windows, is performed.

According to some possible implementations, a device may include a plurality of analog memory devices to: sample an analog input during respective time windows of a sampling window; store respective analog signals based on sampling the analog input during the respective time windows; and provide respective analog outputs based on storing the respective analog signals, wherein at least one of: an output rate, associated with providing the respective analog outputs, is different from a sampling rate associated with sampling the analog input during the respective time windows, an output order, associated with providing the respective analog outputs, is different from a sampling order associated with sampling the analog input during the respective time windows, or a time at which a read-out phase, associated with providing the first and second analog outputs, is performed, is significantly different from a time at which a write phase, associated with sampling the analog input during the first and second time windows, is performed.

DETAILED DESCRIPTION

The following detailed description of example implementations refers to the accompanying drawings. The same reference numbers in different drawings may identify the same or similar elements.

Typically, a sampling rate at which a device (e.g., a receiver in a RADAR system, a receiver in a LiDAR system, and/or the like) samples an analog input signal imparts performance requirements of one or more other components of the device. For example, when a device samples analog input signals at a relatively high sampling rate, the device needs interfaces with relatively high bandwidths; ADCs with sufficiently high sampling rates and bit widths; and high performance DSPs in order to keep up with the sampling rate. However, such components may have an increased cost, size (e.g., in on-chip area), amount of power consumption, and/or complexity as compared to components with relatively lower performance characteristics (e.g., components that can be used for comparatively lower sampling rates).

Some implementations described here provide a device including analog memory devices, where each analog memory device is capable of storing an analog signal based on sampling an analog input during a respective time window (e.g., a time during which the analog memory device is selectively coupled to collect charge on the analog memory device). In some implementations, the analog memory devices may provide analog outputs based on the stored analog signals. Notably, a sampling rate, associated with sampling the analog input, may be different from (e.g., significantly higher than) an output rate associated with providing the analog outputs. For example, the sampling rate can be at least twice, at least three times or at least four times higher than the output rate. Thus, in some cases, the analog input may be sampled at a relatively high sampling rate, while allowing cost, size, an amount of power consumption, and/or complexity of one or more other components of the device to be reduced (e.g., as compared to components associated with an inferior device).

Figure 1A:
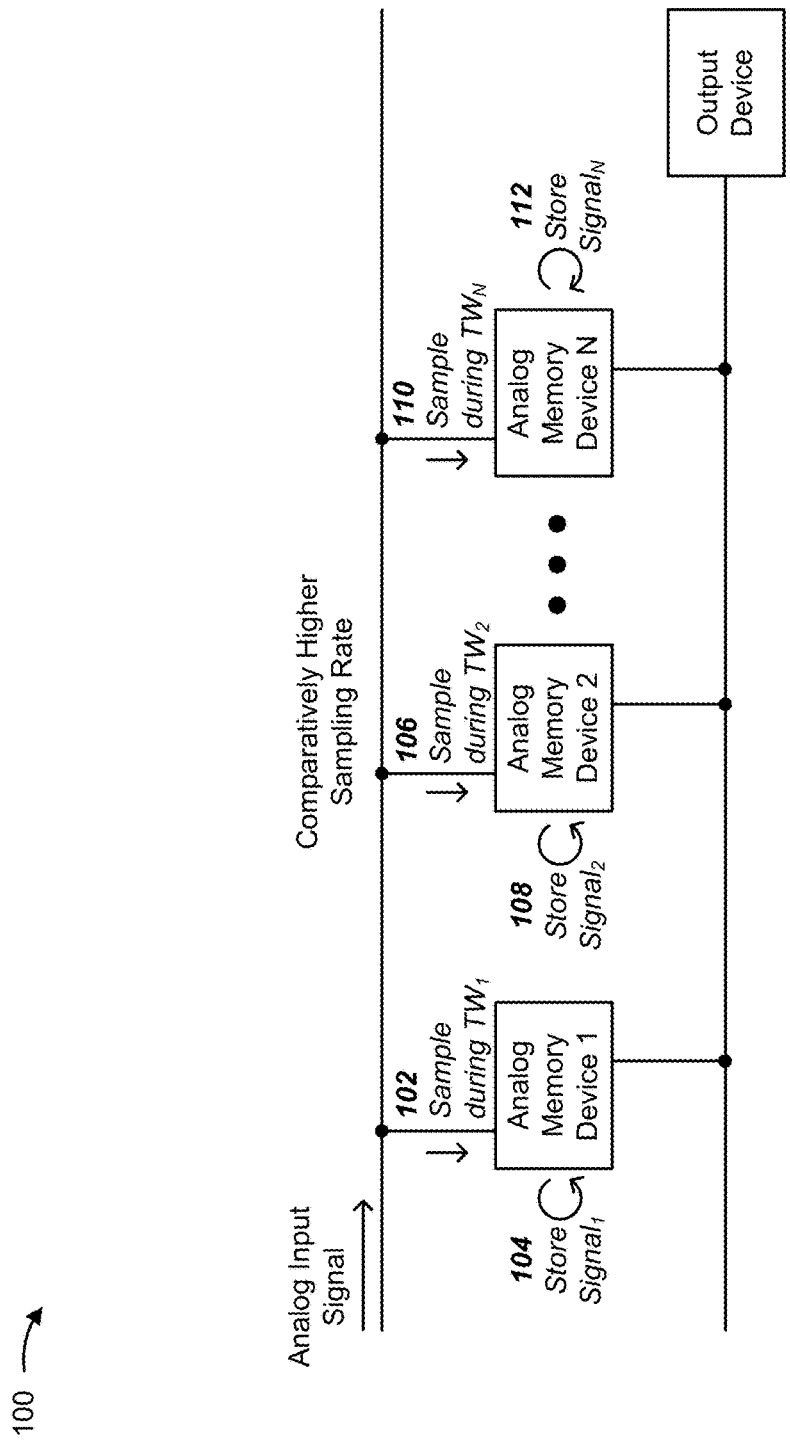
FIGS. 1A and 1B are diagrams of an overview of an example implementation described herein.
Figure 1B:
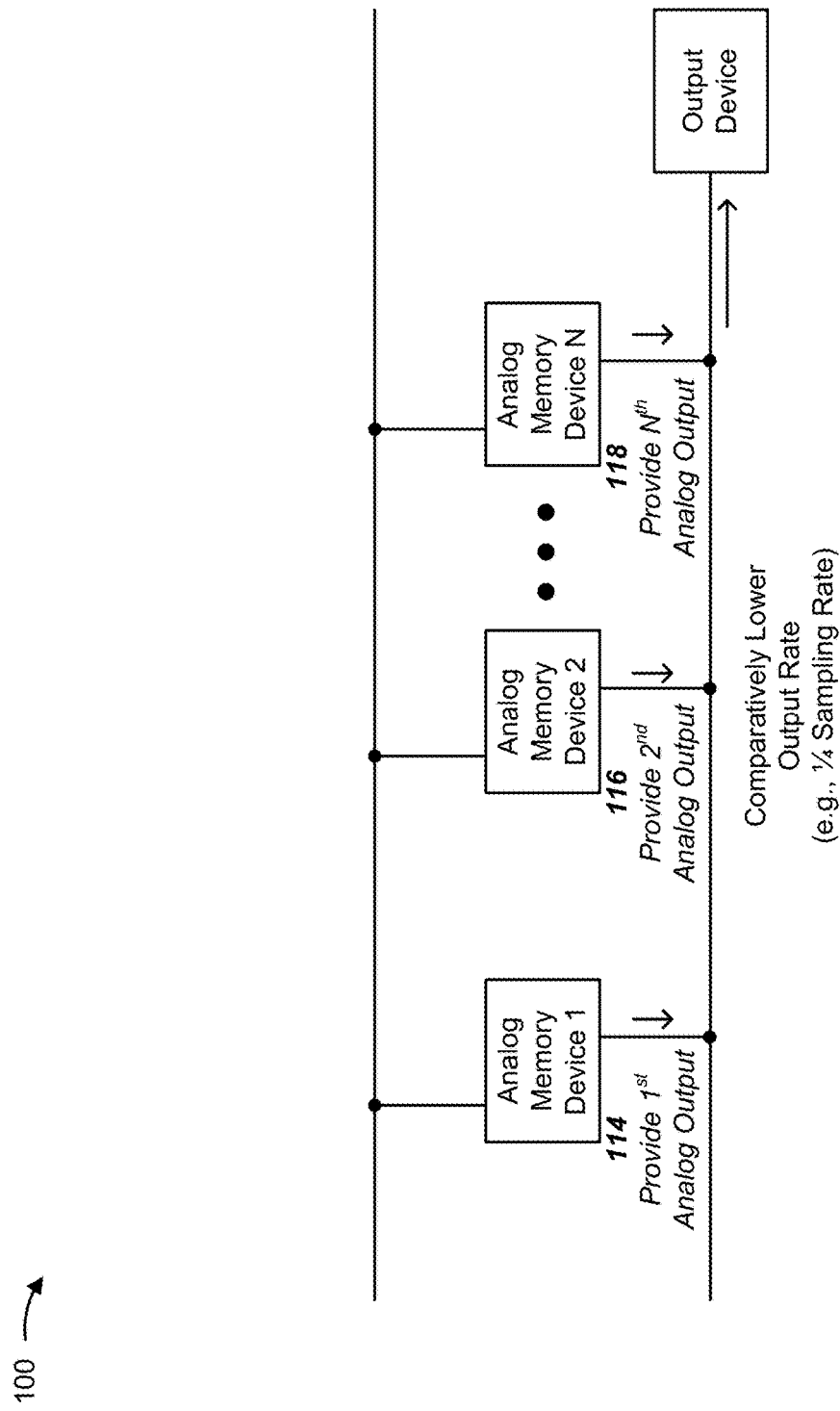

FIGS. 1A and 1B are diagrams of an overview of an example implementation 100 described herein. As shown in FIG. 1A, a device may include multiple analog memory devices (e.g., analog memory device 1 through analog memory device N (N>1), each of which may comprise a capacitor) arranged to sample an analog input (e.g., a voltage signal, a current signal). As shown in FIG. 1, each input of the analog memory devices is coupled to a common line on which the analog signal is provided. According to some embodiments, the analog signal may be a time varying sensor signal. As further shown, the device may include an output device (e.g., an ADC connected to a DSP, an analog processor, and/or the like) to which the analog memory devices are capable of providing respective analog outputs.

FIG. 1A is a diagram illustrating a phase of operation of the device during which the analog memory devices sample the analog input and store analog signals (sometimes referred to as a write phase or a record phase).

As shown by reference number 102, analog memory device 1 may sample the analog input during a first time window of a sampling window. For example, at a start of the first time window ($TW_1$), a write switch of analog memory device 1 may be in an open position that allows the analog input to be provided to analog memory device 1, while write switches of analog memory device 2 through analog memory device N may be in a closed position that prevents the analog input from being sampled by analog memory device 2 through analog memory device N. As shown by reference number 104, analog memory device 1 may store a first analog signal ($signal_1$) based on the sample taken during the analog input during $TW_1$. Here, at an end of $TW_1$, the write switch of analog memory device 1 may be switched to the closed position (e.g., such that analog memory device 1 stops sampling the analog input) and the analog sample is stored in the analog memory device 1.

As shown by reference number 106, at a start of a second time window ($TW_2$, which may be a same time point as the end of $TW_1$) the write switch of analog memory device 2 may be switched to the open position that allows the analog input to be provided to analog memory device 2. As shown by reference number 108, analog memory device 2 may store a second analog signal ($signal_2$) based on sampling the analog input during time window $TW_2$. Here, at an end of $TW_2$, the write switch of analog memory device 2 may be switched to the closed position (e.g., such that analog memory device 2 stops sampling the analog input).

As shown by reference numbers 110 and 112, the above described process can be continued until analog memory device N has stored an analog signal ($signal_N$) based on sampling analog input during an $N^{th}$ time window ($TW_N$), each time window being different to the other time windows. Each sampling window is thus divided into multiple subsequent time windows. In this way, the analog memory devices of the device may each store an analog signal that corresponds to a portion of the analog input during a respective time window of the sampling window. Put another way, each of the analog memory devices stores a respective time discretized portion of a waveform of the analog input. An analog memory device stores the respective portions in an analog manner, i.e. the value (e.g., voltage or charge) stored in the analog memory is not quantized but can vary continuously during the sampling.

In some implementations, as noted in FIG. 1A, the sampling rate, associated with sampling the analog input, may be different from (e.g., comparatively higher than) an output rate at which analog outputs are provided by the analog memory device, as described below.

FIG. 1B is a diagram illustrating a phase of operation of the device during which the analog memory devices provide analog outputs (sometimes referred to as a read-out phase). In some implementations, the analog memory devices may provide the analog outputs after the end of the sampling window (e.g., after analog memory device N has stored $signal_N$ associated with $TW_N$).

As shown by reference number 114, analog memory device 1 may provide a first analog output that corresponds to $signal_1$ stored by analog memory device 1. For example, a read switch of analog memory device 1 may be in an open position that allows the analog output, corresponding to $signal_1$, to be provided to the output device, while read switches of analog memory device 2 through analog memory device N may be in a closed position that prevents their respective analog outputs from being provided to the output device. Here, after analog memory device 1 has provided the first analog output, the read switch of analog memory device 1 may be switched to the closed position.

As shown by reference number 116, after analog memory device 1 has provided the first analog output, analog memory device 2 may provide a second analog output that corresponds to $signal_2$ stored by analog memory device 2. For example, a read switch of analog memory device 2 may be switched to an open position that allows the analog output, corresponding to $signal_1$, to be provided to the output device, while read switches of the other analog memory devices may be in the closed position. Here, after analog memory device 2 has provided the second analog output, the read switch of analog memory device 2 may be switched to the closed position.

As shown by reference number 118, the above described process can be continued until analog memory device N has provided an $N^{th}$ analog output, corresponding to $signal_N$ stored by analog memory device N. In this way, the analog memory devices of the device may each provide an analog output that corresponds to the respective stored analog signals.

In some implementations, as noted in FIG. 1B, the output rate, associated with providing the analog outputs, may be different from (e.g., comparatively lower than) the sampling rate. In other words, the rate (sampling rate being the inverse of the duration of one time window) at which the analog memory devices sample the analog input may be different from a rate (inverse of the duration of an output time of one analog memory) at which the analog memory devices provide the analog outputs.

Figure 1C:
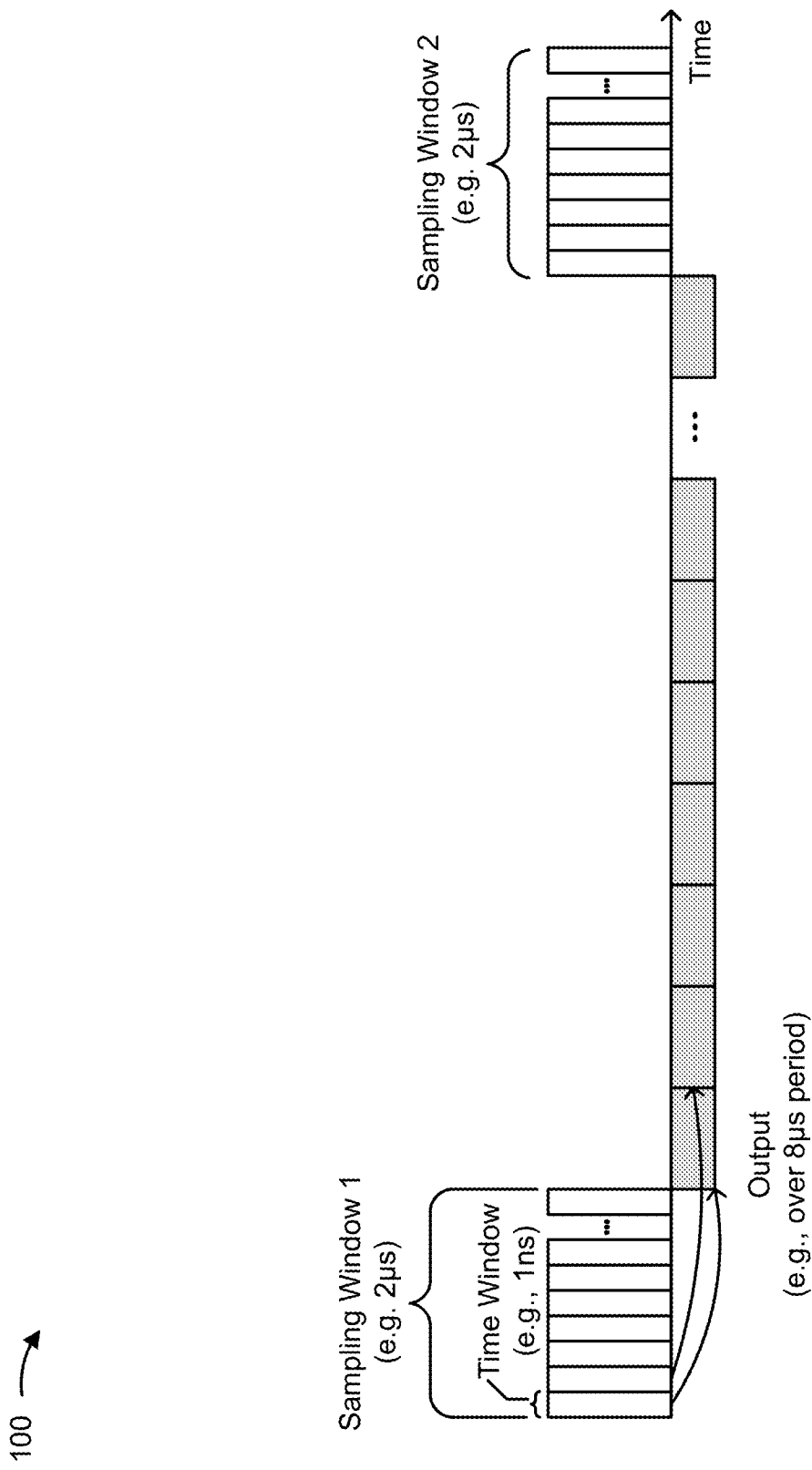
FIG. 1C is a diagram illustrating the relationship between a sampling windows, its associated time windows, and analog signal outputs.

As a particular example, in a LiDAR system with a target range of 300 meters (m), a pulse of output light, provided by a device, may take up to approximately 2 microseconds (μs) to return to the device. Thus, starting with triggering the transmission of the pulse towards the object, the device may be configured to record an analog input signal for 2 μs (e.g., (2×300 m)/3×10⁸ meters per second (m/s) 2 μs). Thus, the sampling window in this example has a duration of 2 µs. FIG. 1C is a diagram illustrating the relationship between the sampling window, its associated time windows, and output of associated analog signals with reference to the above described example.

As shown, a sampling window lasts 2 µs in this example in order to be able to detect pulses reflected from objects within a distance of 300 m or less. Here, if switches of the analog memory devices are opened and closed in the manner described above using a clock of 1 gigahertz (GHz), every 1 nanosecond (ns) another one of the memory devices is selected to store a signal. In other words, the sampling rate is 1 sample per nanosecond (i.e., each time window is 1 ns in duration). In this example, since 2 µs of input signal are to be recorded, 2000 analog memory devices may be used to store the analog input, where each analog memory device stores, during its associated time window of $1/2000^{th}$ (e.g., 1 ns) of the sampling window, the analog signal value present at the analog input during the respective time window Continuing with this example, assume that a rate at which light pulses are provided (i.e., a pulse repetition frequency) is 100 kilohertz (kHz), meaning that one pulse is transmitted every 10 µs. Here, since the recording phase (sampling window) is only 2 µs with 8 µs to the next recording phase (the next sampling window), this leaves 8 µs of time for the read-out phase. Thus, as illustrated in FIG. 1C, the analog outputs may be provided over the 8 µs period. In other words, the required output rate is reduced by a factor of four (e.g., since the amount of time to perform the read-out phase is four times longer than the write phase). This places a lower burden on a bandwidth of an interface towards the output device, and relaxes requirements on the output device itself. Further, the reduced output rate reduces a required sampling rate of the output device by a factor of four, which reduces cost, size, and/or complexity of the output device (e.g., since an ADC with both a high sampling rate and a high bit width may be costly, undesirably large in area, and/or have a complex design). Thus, in some implementations, the values stored in the analog memories are output after a respective sampling window.

Additionally, since the analog signals are stored by the analog memory devices before analog-to-digital conversion (rather than after analog-to-digital conversion), an amount of area and/or power dedicated to memory of the device may be decreased. For example, in a case when outputs are stored as digital signals after analog-to-digital conversion using an 8-bit ADC, each digital signal (e.g., corresponding to a given analog output) requires 8 memory devices (e.g., 8 memory cells), each to store one of the 8 bits. However, when outputs are stored as analog signals before analog-to-digital conversion, each analog signal (e.g., corresponding to a given analog output) requires only one analog memory device. As such, an amount of area and/or power consumption needed for storing the signals is reduced.

Notably, while the above example is described in the context of a sampling rate, associated with the write phase, being comparatively higher than an output rate associated with the read-out phase, other implementations are possible. For example, in some implementations, the output rate, associated with the read-out phase, may be higher than the sampling rate associated with write phase. As another example, in some implementations, an output order associated with the read-out phase (e.g., an order in which analog memory devices provide analog outputs) may be different from a sampling order associated with the write phase (e.g., an order in which the analog memory devices sample the analog input). As another example, an output time associated with the read-out phase (e.g., a time at which the read-out phase is initiated or performed) may be significantly different from (e.g., significantly later than, such as several microseconds or more) a sampling time associated with the write phase (e.g., a time at which the write phase is initiated or performed, such as the beginning of the respective sampling window). As described above, the output time can be after a respective sampling window, i.e. in the time period between two consecutive sampling windows. The difference in time can be according to some embodiments at least the time duration of the sampling window. Generally, implementations described herein provide a device with analog memory devices that allow the read-out phase and the write phase to be performed independently (e.g., with respect to rate, order, and/or time) in the analog domain.

As indicated above, FIGS. 1A-1C are provided merely as examples. Other examples are possible and may differ from what was described with regard to FIGS. 1A-1C.

Figure 2A:
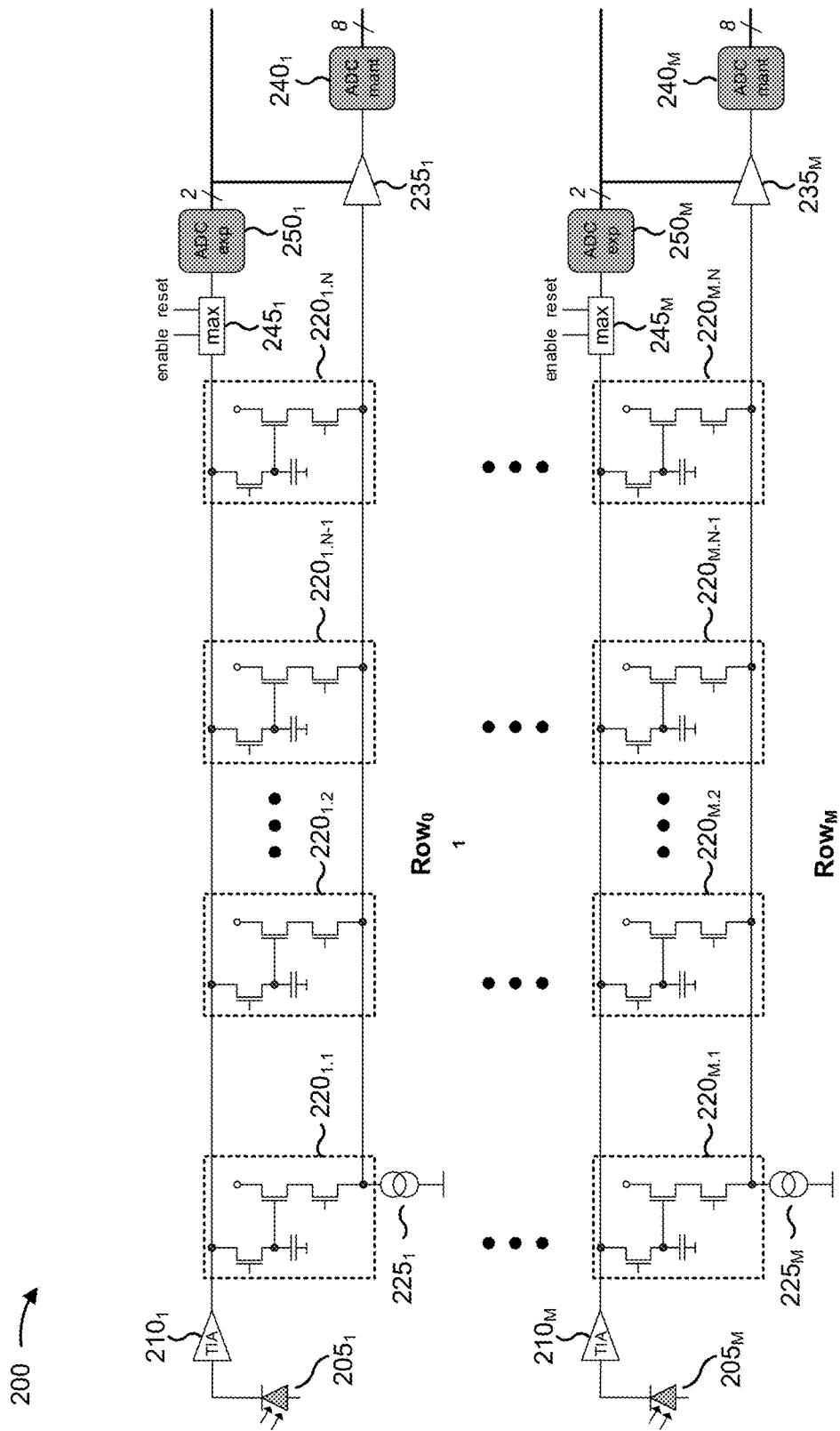
FIGS. 2A and 2B are diagrams associated with an example device including analog memory devices.
Figure 2B:
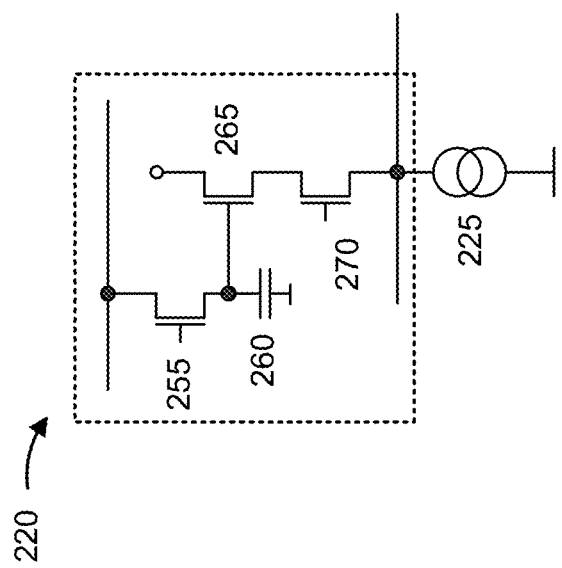

FIGS. 2A and 2B are diagrams associated with an example device 200 including analog memory devices. As shown in FIG. 2A, components of device 200 may be arranged in a set of rows (e.g., 1 through M (M≥1), each corresponding to a channel of device 200), where each row includes a photodiode 205, a transimpedance amplifier (TIA) 210, N analog memory devices 220, a current source 225, an amplifier 235, an ADC 240, an optional peak detector 245, and an optional ADC 250.

Photodiode 205 is a component that converts light to electrical current. For example, in a LiDAR system, photodiode 205 may receive light (e.g., including a portion of a laser pulse that is reflected by an object, including "noise" light from an environment of the LiDAR system, and/or the like), and may convert the light to a current signal. As shown, each photodiode 205 in device 200 is associated with a different row of analog memory devices 220. In some implementations, analog memory devices 220 of a given row may store time discretized portions of an analog input corresponding to the current signal provided by an associated photodiode 205, as described below. Notably, while device 200 is shown and described as including photodiodes 205 in the example implementations shown and described herein, device 200 may include any other type of device capable of providing an analog input (e.g., a current signal, a voltage signal) for recording by analog memory devices 220 of device 200.

TIA 210 includes a component to convert the current signal, provided by photodiode 205, to a voltage signal. In some implementations, TIA 210 converts the current signal to a voltage signal in order to allow analog memory devices 220 to store analog signals based on an analog input in the form of a voltage signal, as described below. Notably, when analog memory devices 220 of device 200 are to store analog signals based on an analog input in the form of a current signal (e.g., as described below), TIA 210 may be replaced with an amplifier that amplifies the current signal (rather than converting the current signal to a voltage signal).

Analog memory device 220 includes a device to sample an analog input, store an analog signal based on sampling the analog input, and provide an analog output based on storing the analog signal, as described herein. As shown in FIG. 2A, each of the M rows of device 200 may include N (N>1) analog memory devices 220.

FIG. 2B is a diagram illustrating example components of analog memory device 220. As shown in FIG. 2B, analog memory device 220 may include a write switch 255, a capacitor 260, a source follower 265, and a read switch 270.

Write switch 255 is a component associated with permitting analog memory device 220 to sample an analog input in association with storing a corresponding analog signal. In some implementations, as shown in FIG. 2B, write switch 255 may include a transistor. In some implementations, write switch 255 may be switched to an open position at a start of a time window during which analog memory device 220 is to sample the analog input (e.g., provided by TIA 210) and store a corresponding analog signal, and may be switched to a closed position at an end of the time window (e.g., while a write switch 255 of a next analog memory device 220 may be switched to the open position for recording during a next time window).

Capacitor 260 is a component associated with storing an analog signal based on sampling an analog input. In some implementations, capacitor 260 may be charged when write switch 255 is in an open position during a time window within which analog memory device 220 is to store an analog signal. For example, when the analog input is a voltage signal, capacitor 260 may be charged to the voltage of the analog signal. As another example, when the analog input is a current signal, the current signal charges capacitor 260, where the voltage stored in capacitor 260 is a function of the current, the amount of time that write switch 255 is in the open position, and a capacitance of capacitor 260.

Source follower 265 is a component that copies the voltage of capacitor 260 without destroying the charge on capacitor 260. In some implementations, as shown in FIG. 2B, source follower 265 may include a transistor, and may copy the voltage of capacitor 260 based on a current provided by current source 225. For example, when read switch 270 is open during the read-out phase, read switch 270 connects the line to source follower 265 which, based on a current provided by current source 225, copies voltage from capacitor 260.

Read switch 270 is a component associated with permitting analog memory device 220 to provide an analog output. In some implementations, as shown in FIG. 2B, read switch 270 may include a transistor. In some implementations, read switch 270 may be switched to an open position at a time when analog memory device 220 is to provide an analog output (e.g., corresponding to the analog signal stored by capacitor 260), and may be switched to a closed position after providing the analog output (e.g., while a read switch 270 of a next analog memory device 220 may be switched to the open position for providing a next analog output).

In operation, during the write phase, analog memory device 220 may sample the analog input, provided by TIA 210, during a given time window of a sampling window. For example, at a start of the time window, write switch 255 may be switched to the open position (e.g., while write switches 255 of other analog memory devices 220 in the row are in the closed position) such that the analog input charges capacitor 260, thereby storing an analog signal associated with the time window. Here, at an end of the time window, write switch 255 may be switched to the closed position. Write switch 255 of a next analog memory device 220 (e.g., a next analog memory device 220 in the row) may be switched to the open position, and this process may be repeated for each time window of the sampling window. Notably, in operation of device 200, each capacitor 260 (associated with a different analog memory device 220) is charged at a different time (e.g., during different time windows).

During the read-out phase, analog memory device 220 may provide an analog output that corresponds to the voltage stored by capacitor 260 (i.e., the analog signal stored by analog memory device 220). For example, read switch 270 of analog memory device 220 may be switched to the open position that allows source follower 265 to copy the voltage stored by capacitor 260 (e.g., while read switches 270 of other analog memory devices 220 in the row are in the closed position), and causes analog memory device 220 to provide an analog output on the line to amplifier 235. Here, after analog memory device 220 has provided the analog output, read switch 270 of analog memory device 220 may be switched to the closed position. Read switch 270 of a next analog memory device 220 (e.g., a next analog memory device 220 in the row) may be switched to the open position, and this process may be repeated such that each analog memory device 220 of the row provides an analog output. Notably, in operation of device 200, no recharge of capacitors 260 may be needed, as the read-out may be sufficiently fast such that significant discharge is avoided (e.g., since a given capacitor 260 may need to hold a charge for a few microseconds or less between the write phase and the read-out phase).

Returning to FIG. 2A, current source 225 includes a current source that allows source follower 265 to copy the voltage stored by capacitor 260 for output of an analog signal by analog memory device 220. In some implementations, as shown in FIG. 2A, current source 225 may be shared by multiple analog memory devices 220.

Amplifier 235 includes an amplifier to amplify analog outputs provided by analog memory devices 220. In some implementations, a gain of amplifier 235 may be configurable based on a signal provided by optional peak detector 245, as described below.

ADC 240 includes a component to convert analog signals to digital signals. For example, ADC 240 may include a component to convert analog outputs, provided by analog memory devices 220, to digital signals. In a particular example, as indicated in FIG. 2A, ADC 240 may convert an analog output, associated with a given analog memory device 220, to an 8 bit digital signal. In some implementations, after conversion, ADC 240 may provide the digital signals to another component (e.g., a DSP) for processing.

In some implementations, an output rate at which the analog signals are provided to ADC 240 may allow a requirement for a bandwidth of an interface towards ADC 240 and/or a requirement of ADC 240 itself to be relaxed, as described above (e.g., when an amount of time during which the analog signals may be provided is significantly longer than the sampling window). Thus, cost, size, and/or complexity of an interface (e.g., between analog memory devices 220 and ADC 240, between ADC 240 and the DSP), ADC 240, and/or the DSP may be reduced. Further, an amount of area or power needed for memory in device 200 may be reduced since the analog signals are stored by analog memory devices 220 before analog-to-digital conversion, as described above.

Optional peak detector 245 includes a component to determine a maximum value of the analog input during a given sampling window during the write phase, and optional ADC 250 includes a component to convert the maximum value to a digital value. In some implementations, the maximum value, and the corresponding digital value, can be used to control amplifier 235. For example, in each row of analog memory devices 220, the maximum value of the analog input can be digitized (e.g., according to a logarithmic scale) by ADC 250. Here, assume that amplifier 235 is capable of amplifying a given analog output by 0 decibels (dB), 6 dB, 12 dB, or 18 dB, where an amount of gain is doubled with each step. In this example, if peak detector 245 determines a relatively small maximum value for analog input, then ADC 250 may digitize the relatively small value (e.g., based on the value failing to satisfy a threshold), and may provide a corresponding digital value (e.g., 2 bits representing a value of 0) that causes the gain of amplifier 235 to be set high (e.g., 18 dB). Conversely, if peak detector 245 determines a relatively large maximum value (e.g., for a relatively strong analog input), then ADC 250 may digitize the relatively large value (e.g., based on the value satisfying a threshold), and may provide a corresponding digital value (e.g., 2 bits representing a value of 3) that causes the gain of amplifier 235 to be set low (e.g., 0 dB). In some implementations, the digital values generated by ADC 250 are the first to be transmitted (e.g., to a DSP) since these values encode the gain of amplifier 235.

Continuing with this example, during the read-out phase, analog outputs of analog memory devices 220 are provided (e.g., at each clock cycle) such that each analog output is amplified by amplifier 235, digitized by ADC 240, and transmitted (e.g., to the DSP). Here, since amplifier 235 is set to a particular gain, the digital signals, provided by ADC 240, are effectively multiplied by this gain. As the gain is a power of two, the digital values associated with peak detector 245 essentially represent an exponent for the digital signals that follow. For example, if the exponent is 3, then the gain of amplifier 235 was 0 dB, which indicates that the analog input was large and the transmitted digital signals have to be shifted by three bits to arrive at the real value. Conversely, if the exponent was 0, then the gain of amplifier 235 was 18 dB, which indicates that the analog input was small and the digital signals do not have to be shifted. In this example, a form of data compression that saves three bits per value may be implemented. In some implementations, if amplifier 235 is equipped to provide another number of gain levels (e.g., four or more), then another number of bits can be saved. For example, if amplifier 235 can also provide gains of 0 dB, 6 dB, 12 dB, 18 dB, or 24 dB, then up to four bits can be saved using this technique. As shown in FIG. 2A, peak detector 245 may include a reset switch that allows that the maximum value determined by peak detector 245 to be reset (e.g., to 0) before a subsequent write phase.

In some implementations, the analog input may be a voltage signal, as described in the above examples. Alternatively, the analog input may be a current signal that charges a given capacitor 260 during a respective time window, where the voltage stored in the given capacitor 260 is a function of the current, the amount of time that write switch 255 is in the open position, and a capacitance of capacitor 260. In such cases, device 200 may include an amplifier that amplifies a current provided by photodiode 205 (e.g., rather than a TIA 210), as indicated above. Further, in such cases, capacitor 260 of a given analog memory device 220 may need to be reset between write phases. Thus, in some implementations, capacitor 260 may include a reset switch.

In some implementations, using an analog input in the form of a current signal (e.g., rather than a voltage signal) allows analog signal addition (sometimes referred to as summing) to be implemented. For example, assume that capacitor 260, included in a given analog memory device 220, is charged (e.g., during a first time window) based on an analog input in the form of a current signal. Here, if capacitor 260 is not reset before a second time window during which capacitor 260 is to record, a charge, stored by capacitor 260 during the second time window, is added to the charge stored during the first time window. Thus, when analog memory device 220 provides an analog output during the read-out phase, the analog output corresponds to a summed analog signal that represents the cumulative charge during the first and second time windows. This process may be performed for multiple analog memory devices 220 (e.g., such that each of the multiple analog memory devices 220 stores a respective summed analog signal). In some implementations, averaging may be performed based on the summed analog signal (e.g., before being digitized and transmitted), which may improve a signal-to-noise ratio of the analog output. Further, averaging multiple analog signals reduces the output rate of device 200. For example, if ten analog signals are to be averaged, then analog outputs need to be provided to ADC 240 after every tenth write phase, thereby reducing the output rate by a factor of ten (e.g., as compared to providing analog outputs after every write phase). A similar reduction to the data rate from ADC 240 to the DSP is also present.

In some implementations, the write phase and the read-out phase may be separate phases (e.g., such that the write phase is completed before the read-out phase begins), as described in the above examples. Alternatively, the write phase and the read-out phase may overlap (e.g., such that the write phase takes place at least partially concurrently with the read-out phase). For example, while analog signals for averaging are being stored by analog memory devices 220 during the write phase, analog outputs for other analog signals, associated with a previous average, may be provided (e.g., at a much lower output rate). In some implementations, in order to implement such a scheme, the number of analog memory devices 220 may be doubled (e.g., such that device 200 includes two sets of analog memory devices 220) and a ping pong buffer may be used. Here, while the write phase is performed in one set of analog memory devices 220, the read-out phase may be performed for the other set of analog memory devices 220. The roles of the two sets of analog memory devices 220 may then be switched (e.g., using the ping pong buffer), and the process can be repeated. In some implementations, overlapping the write phase and the read-out phase in this way may allow for efficient acquisition and preprocessing of data from multiple analog signals at high speeds.

In some implementations, an analog signal stored by analog memory devices 220 is no longer needed after the read-out phase. Thus, a destructive read-out mechanism can be used in some implementations. For example, instead of providing source follower 265 to buffer the voltage stored by capacitor 260, a charge amplifier could be used. In some implementations, the charge amplifier may allow the same transistor to be used for both write switch 255 and read switch 270, and/or may allow the same line to be used for writing and reading-out capacitor 260. Thus, the destructive read-out mechanism can reduce an amount of area needed for device 200, in some implementations.

The number and arrangement of devices and components shown in FIGS. 2A and 2B are provided as examples. In practice, there may be additional devices and/or components, fewer devices and/or components, different devices and/or components, or differently arranged devices and/or components than those shown in FIGS. 2A and 2B. Furthermore, two or more devices and/or components shown in FIGS. 2A and 2B may be implemented within a single device and/or a single component, or a single device and/or a single component shown in FIGS. 2A and 2B may be implemented as multiple, distributed devices and/or components. Additionally, or alternatively, a set of devices (e.g., one or more devices) and/or a set of components (e.g., one or more components) shown in FIGS. 2A and 2B may perform one or more functions described as being performed by another set of devices or another set of components shown in FIGS. 2A and 2B.

In some implementations, a given row of analog memory devices 220 may become undesirably long. For example, if 2000 capacitors 260 are required in a given row, as described in the above example, it may be difficult to drive lines of device 200 with sufficient bandwidth and accuracy. In such cases, analog memory devices 220 of a given row may be arranged in a hierarchical structure.

Figure 3A:
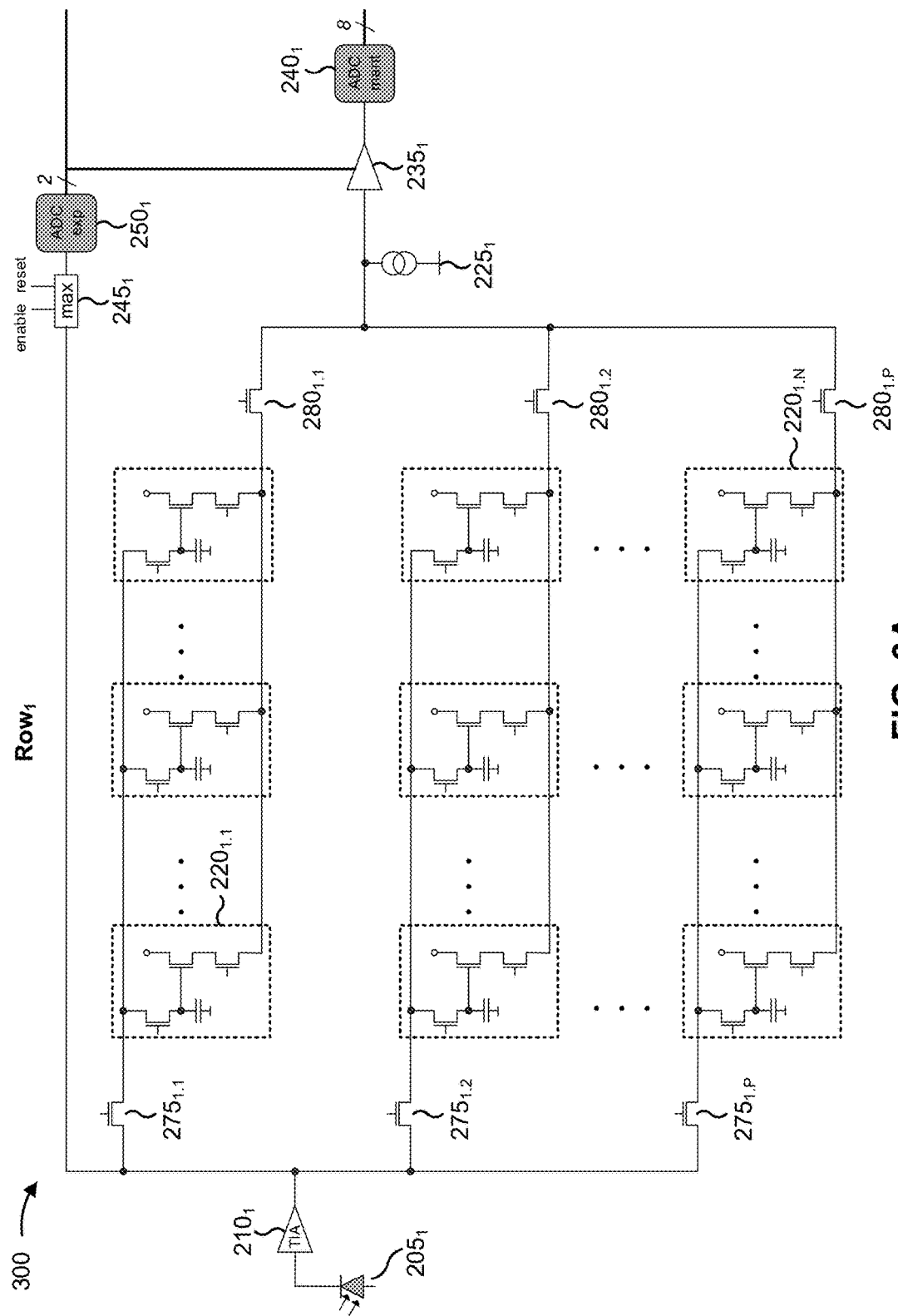
FIGS. 3A and 3B are diagrams of additional example devices including analog memory devices arranged in a hierarchical structure.
Figure 3B:
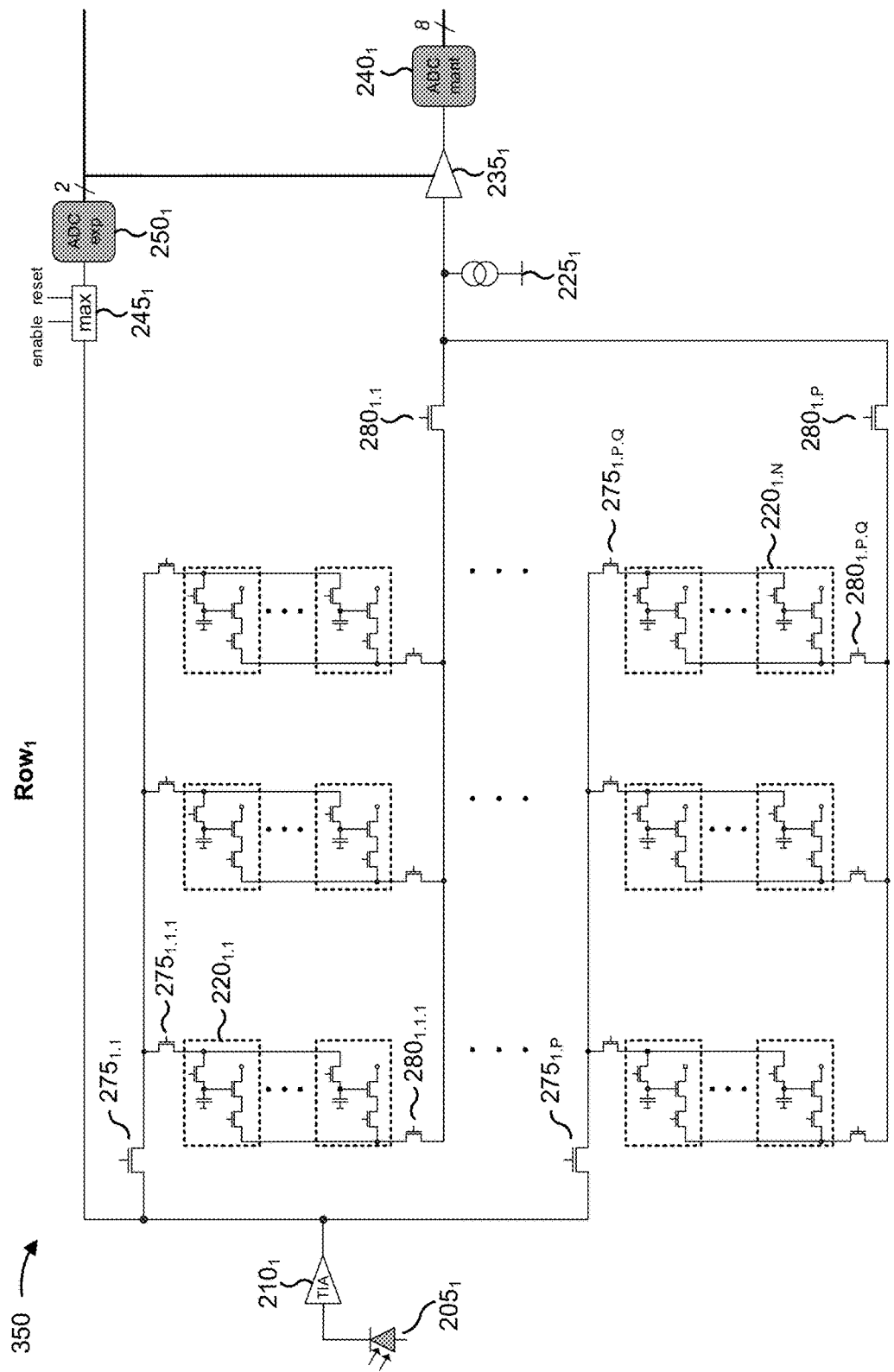

FIGS. 3A and 3B are diagrams of additional example devices 300 and 350, respectively, including analog memory devices 220 arranged in a hierarchical structure.

FIG. 3A is a diagram illustrating device 300 with a two-level hierarchy. As shown in FIG. 3A, a set of write switches 275 may be arranged to select (during the write phase) one of P (P>1) sub-rows of the hierarchical structure and, within each of the P sub-rows, individual analog memory devices 220 are selected using write switches 255, as described above. As further shown, a set of read switches 280 may be arranged to select (during the read-out phase) one of the P sub-rows of the hierarchical structure and, within each of the P sub-rows, individual analog memory devices 220 are selected using read switches 270, as described above. In this way, a length of a line in a given row may be reduced, thereby allowing the lines to be driven with sufficient bandwidth and accuracy.

Notably, the number of hierarchical levels is not limited to two. For example, a given row of analog memory devices 220 may be arranged in three or more hierarchical levels. FIG. 3B is a diagram illustrating device 350 with a three-level hierarchy. As shown in FIG. 3B, device 350 may include write switches 275 and read switches 280 similar to those described in association with device 300.

The number and arrangement of devices and components shown in FIGS. 3A and 3B are provided as examples. In practice, there may be additional devices and/or components, fewer devices and/or components, different devices and/or components, or differently arranged devices and/or components than those shown in FIGS. 3A and 3B. Furthermore, two or more devices and/or components shown in FIGS. 3A and 3B may be implemented within a single device and/or a single component, or a single device and/or a single component shown in FIGS. 3A and 3B may be implemented as multiple, distributed devices and/or components. Additionally, or alternatively, a set of devices (e.g., one or more devices) and/or a set of components (e.g., one or more components) shown in FIGS. 3A and 3B may perform one or more functions described as being performed by another set of devices or another set of components shown in FIGS. 3A and 3B.

Figure 4:
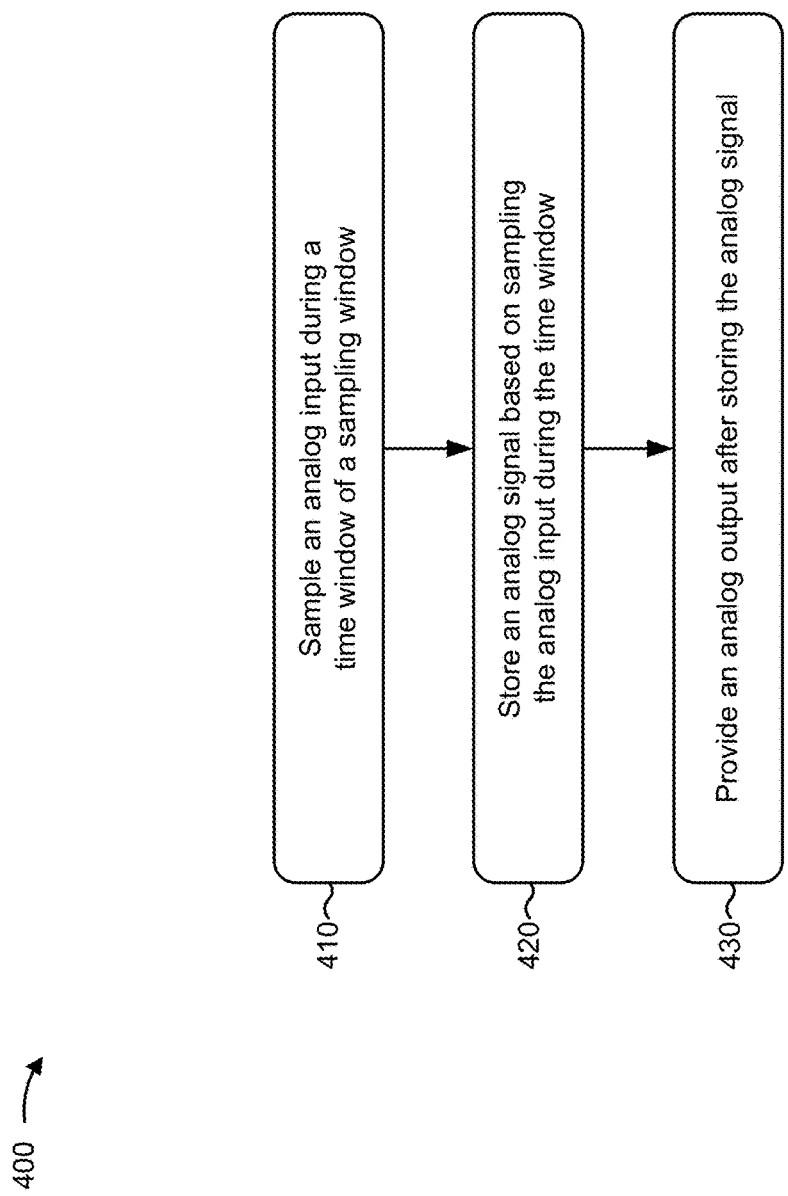
FIG. 4 is a flow chart of an example process for storing an analog signal based on sampling an analog input during a particular time window, and providing an analog output after storing the analog signal.

FIG. 4 is a flow chart of an example process 400 for storing an analog signal based on sampling an analog input during a particular time window, and providing an analog output after storing the analog signal. In some implementations, one or more process blocks of FIG. 4 may be performed by analog memory device 220.

As shown in FIG. 4, process 400 may include sampling an analog input during a time window of a sampling window (block 410). For example, analog memory device 220 may sample (e.g., using write switch 255) an analog input during a time window of a sampling window, as described above.

As further shown in FIG. 4, process 400 may include storing an analog signal based on sampling the analog input during the time window (block 420). For example, analog memory device 220 (e.g., capacitor 260) may store a first analog signal based on sampling the analog input during the time window, as described above.

As further shown in FIG. 4, process 400 may include providing an analog output after storing the analog signal (block 430). For example, analog memory device 220 may provide (e.g., using read switch 270) an analog output after storing the analog signal, as described above. In some implementations, a sampling rate (e.g., 1/time window), associated with sampling the analog input during the sampling window, is higher than an output rate associated with providing the analog output, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

Some implementations described here provide a device including analog memory devices 220, where each analog memory device 220 is capable of storing an analog signal based on sampling an analog input during a respective time window. In some implementations, analog memory devices 220 may provide analog outputs based on the stored analog signals. Notably, a sampling rate, associated with sampling the analog input, may be significantly higher than an output rate associated with providing the analog outputs. Thus, the analog input may be sampled at a relatively high sampling rate, while allowing cost, size, an amount of power consumption, and/or complexity of one or more other components of the device (e.g., an interface, an ADC, a DSP) to be reduced (e.g., as compared to components associated with an inferior device).

As described above, while some examples described herein are described in the context of a sampling rate, associated with a write phase, being different from (e.g., comparatively higher or lower than) an output rate associated with a read-out phase, other implementations are possible using the above described architectures. For example, in some implementations, an order in which analog memory devices 220 provide analog outputs during the read-out phase (sometimes referred to as an output order) may be different from an order in which analog memory devices 220 sample the analog input during the write phase (sometimes referred to as a sampling order). As another example, in some implementations, a time at which the read-out phase is initiated or performed (sometimes referred to as an output time) may be different from (e.g., significantly later than, such as several microseconds or more) a time at which the write phase is initiated or performed (sometimes referred to as a sampling time). In other words, in general, the implementations described above provide a device including analog memory devices 220 that allow the read-out phase and the write phase to be performed independently (e.g., with respect to rate, order, and/or time) in the analog domain.

The foregoing disclosure provides illustration and description, but is not intended to be exhaustive or to limit the implementations to the precise form disclosed. Modifications and variations are possible in light of the above disclosure or may be acquired from practice of the implementations.

For example, while the implementations and examples may be described in the context of a LiDAR system, other applications are possible. Generally, the above described implementations can be used in any application in which a number of signals need to be sampled at a high rate such that processing power, on-chip area, heat dissipation, and/or the like is insufficient or difficult to perform in the digital domain. Put another way, the implementations described herein may be used for any circuitry in which signal processing and/or storage capabilities are lower than required when sampling an input signal at a given rate.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A device, comprising:
   a first analog memory device to:
      sample an analog input during a first time window of a sampling window,
      store a first analog signal based on sampling the analog input during the first time window, and
      provide a first analog output after storing the first analog signal; and
   a second analog memory device to:
      sample the analog input during a second time window of the sampling window,
      store a second analog signal based on sampling the analog input during the second time window, and
      provide a second analog output after storing the second analog signal,
         wherein at least one of:
            an output rate, associated with providing the first and second analog outputs, is different from a sampling rate associated with sampling the analog input during the first and second time windows,
            an output order, associated with providing the first and second analog outputs, is different from a sampling order associated with sampling the analog input during the first and second time windows, or
            a time at which a read-out phase, associated with providing the first and second analog outputs, is performed, is significantly different from a time at which a write phase, associated with sampling the analog input during the first and second time windows, is performed.

2. The device of claim 1, wherein the first analog memory device comprises:
   a read switch to cause the analog input to be sampled during the first time window,
   a capacitor to store the first analog signal,
   a source follower to copy the first analog signal from the capacitor, and
   a write switch to cause the first analog output to be provided,
      wherein the first analog output is provided by the source follower based on copying the first analog signal from the capacitor.

3. The device of claim 1, further comprising a peak detector to:
   determine a maximum value of the analog input during the sampling window; and
   provide, based on the maximum value, an output associated with setting a gain of an amplifier to which the first analog output and the second analog output of the first analog memory device and the second analog memory device, respectively, are provided.

4. The device of claim 1, wherein the first analog memory device is further to:
   sample the analog input during a third time window of the sampling window,
   add a third analog signal, associated with sampling the analog input during the third time window, to the first analog signal to create a summed analog signal, and
   wherein the first analog memory device, when providing the first analog output, is to:
      provide the first analog output after adding the third analog signal to the first analog signal to create the summed analog signal.

5. The device of claim 1, wherein the analog input is a first analog input, and wherein the device further comprises:
   a third analog memory device to:
      sample a second analog input during the first time window of the sampling window,
      store a third analog signal based on sampling the second analog input during the first time window, and
      provide a third analog output after storing the third analog signal; and
   a fourth analog memory device to:
      sample the second analog input during the second time window of the sampling window,
      store a fourth analog signal based on sampling the second analog input during the second time window, and
      provide a fourth analog output after storing the fourth analog signal,
         wherein at least one of:
            an output rate, associated with providing the third and fourth analog outputs, is different from the sampling rate associated with sampling the analog input during the first and second time windows,
            an output order, associated with providing the third and fourth analog outputs, is different from a sampling order associated with sampling the second analog input during the first and second time windows, or
            a time at which a read-out phase, associated with providing the third and fourth analog outputs, is performed, is significantly different from a time at which a write phase, associated with sampling the second analog input during the first and second time windows, is performed.

6. The device of claim 1, wherein the device comprises a plurality of analog memory devices arranged in a hierarchical structure that includes at least two sub-rows, wherein the plurality of analog memory devices includes the first analog memory device and the second analog memory device.

7. The device of claim 6, wherein each of the at least two sub-rows includes at least two sub-rows.

8. The device of claim 1, further comprising a photodiode associated with providing the analog input.

9. The device of claim 1, further comprising an amplifier to amplify the first analog output and the second analog output.

10. The device of claim 1, further comprising an analog-to-digital converter to receive the first analog output and the second analog output from the first analog memory device and the second analog memory device, respectively.

11. The device of claim 1, wherein the analog input is a voltage signal, and
wherein the device further comprises a transimpedance amplifier associated with providing the voltage signal for sampling by the first analog memory device and the second analog memory device.

12. The device of claim 1, wherein the analog input is a current signal, and
wherein the device further comprises an amplifier associated with providing the current signal for sampling by the first analog memory device and the second analog memory device.

13. A method, comprising:
sampling, by a first analog memory device, an analog input during a first time window of a sampling window;
storing, by the first analog memory device, a first analog signal based on sampling the analog input during the first time window;
sampling, by a second analog memory device, the analog input during a second time window of the sampling window;
storing, by the second analog memory device, a second analog signal based on sampling the analog input during the second time window;
providing, by the first analog memory device, a first analog output based on the first analog signal; and
providing, by the second analog memory device, a second analog output based on storing the second analog signal,
wherein at least one of:
an output rate, associated with providing the first and second analog outputs, is different from a sampling rate, associated with sampling the analog input during the first and second time windows,
an output order, associated with providing the first and second analog outputs, is different from a sampling order associated with sampling the analog input during the first and second time windows, or
a time at which a read-out phase, associated with providing the first and second analog outputs, is performed, is significantly different from a time at which a write phase, associated with sampling the analog input during the first and second time windows, is performed.

14. The method of claim 13, further comprising:
determining a maximum value of the analog input during the sampling window; and
providing, based on the maximum value, an output associated with setting a gain of an amplifier to which the first analog output and the second analog output are provided.

15. The method of claim 13, further comprising:
sampling, by the first analog memory device, the analog input during a third time window of the sampling window,
adding, by the first analog memory device, a third analog signal, associated with sampling the analog input during the third time window, to the first analog signal to create a summed analog signal, and
wherein providing the first analog output comprises:
providing the first analog output after adding the third analog signal to the first analog signal to create the summed analog signal.

16. The method of claim 13, wherein the analog input is provided by a photodiode.

17. The method of claim 13, wherein the first analog output and the second analog output are provided to an analog-to-digital converter for converting the first analog output to a first digital value and the second analog output to a second digital value.

18. The method of claim 13, wherein the analog input is a voltage signal.

19. The method of claim 13, wherein the analog input is a current signal.

20. A device, comprising:
a plurality of analog memory devices to:
sample an analog input during respective time windows of a sampling window;
store respective analog signals based on sampling the analog input during the respective time windows; and
provide respective analog outputs based on storing the respective analog signals,
wherein at least one of:
an output rate, associated with providing the respective analog outputs, is different from a sampling rate associated with sampling the analog input during the respective time windows,
an output order, associated with providing the respective analog outputs, is different from a sampling order associated with sampling the analog input during the respective time windows, or
a time at which a read-out phase, associated with providing a first analog output and a second analog output, is performed, is significantly different from a time at which a write phase, associated with sampling the analog input during a first time window and a second time window, is performed.

* * * * *